United States Patent
Hanson et al.

(10) Patent No.: US 7,242,239 B2
(45) Date of Patent: Jul. 10, 2007

(54) PROGRAMMING AND DETERMINING STATE OF ELECTRICAL FUSE USING FIELD EFFECT TRANSISTOR HAVING MULTIPLE CONDUCTION STATES

(75) Inventors: David R. Hanson, Brewster, NY (US); Dureseti Chidambarrao, Weston, CT (US); Gregory J. Fredeman, Wappingers Falls, NY (US); David M. Onsongo, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 11/160,056

(22) Filed: Jun. 7, 2005

(65) Prior Publication Data

US 2006/0273841 A1    Dec. 7, 2006

(51) Int. Cl.
*H01H 85/00*    (2006.01)
(52) U.S. Cl. .................................... 327/525; 365/225.7
(58) Field of Classification Search ................ 327/525, 327/526; 365/225.7
See application file for complete search history.

(56) References Cited

U.S. PATENT DOCUMENTS

| | | | | |
|---|---|---|---|---|
| 4,517,583 A | * | 5/1985 | Uchida ........................ | 257/67 |
| 4,551,641 A | | 11/1985 | Pelley, III .................... | 327/55 |
| 5,042,011 A | | 8/1991 | Casper et al. ................ | 365/205 |
| 5,661,323 A | * | 8/1997 | Choi et al. ................... | 257/378 |
| 5,712,588 A | * | 1/1998 | Choi et al. ................... | 327/525 |
| 5,741,738 A | | 4/1998 | Mandelman et al. ....... | 438/296 |
| 6,384,664 B1 | * | 5/2002 | Hellums et al. ............. | 327/525 |
| 6,438,059 B2 | * | 8/2002 | Akita et al. ................. | 365/225.7 |
| 6,449,202 B1 | | 9/2002 | Akatsu et al. ............... | 365/205 |
| 6,501,679 B2 | * | 12/2002 | Hidaka ........................ | 365/173 |
| 6,639,778 B2 | * | 10/2003 | Smith .......................... | 361/104 |
| 6,703,885 B1 | * | 3/2004 | Fan et al. .................... | 327/308 |
| 6,710,640 B1 | * | 3/2004 | Kothandaraman et al. .. | 327/525 |
| 6,711,074 B2 | * | 3/2004 | Kwon ......................... | 365/200 |
| 6,804,159 B2 | * | 10/2004 | Kamiya et al. ............. | 365/225.7 |
| 7,009,443 B2 | * | 3/2006 | Illegems ..................... | 327/525 |
| 2005/0122159 A1 | * | 6/2005 | Kim et al. ................... | 327/525 |

\* cited by examiner

*Primary Examiner*—Linh My Nguyen
*Assistant Examiner*—Thomas J. Hiltunen
(74) *Attorney, Agent, or Firm*—Daryl K. Neff; H. Daniel Schnurmann

(57) ABSTRACT

A circuit is provided which is operable to program an electrically alterable element, e.g., fuse or antifuse, to a programmed state and determine whether the electrically alterable element is in the programmed state or not. Such circuit includes a multiple conduction state field effect transistor ("multi-state FET") having at least one of a source or a drain coupled to the electrically alterable element to apply a current to the electrically alterable element. The multi-state FET has a first threshold voltage and a second threshold voltage, both being effective at the same time, the second threshold voltage being higher than the first threshold voltage. The gate is operable to control operation of the multi-state FET in multiple states including a) an essentially nonconductive state; b) a first or "low" conductive state when a gate-source voltage exceeds the first threshold voltage, in which the multi-state FET is biased to conduct a relatively low magnitude current for determining the state of the fuse; and c) a second conductive state when the gate-source voltage exceeds the second threshold voltage, in which the multi-state FET is biased to conduct a relatively high magnitude programming current.

15 Claims, 2 Drawing Sheets

PROGRAMMING AND DETERMINING STATE OF ELECTRICAL FUSE USING FIELD EFFECT TRANSISTOR HAVING MULTIPLE CONDUCTION STATES

BACKGROUND OF THE INVENTION

The present invention relates to circuits used to program an electrically blowable fuse, especially integrated circuits having such function.

Fuses are used to support memories of integrated circuits or "chips" such as stand-alone memory chips and memory macros of chips by storing information regarding the allocation of redundancy elements within such memories. Fuses are also used to store permanent settings within chips, such as chips which contain identification codes and the like. When used to support a memory macro of an integrated circuit memory, the macro is tested to identify any failing locations of the macro. A repair solution is then generated for the pattern of failing locations utilizing redundancy elements available on the chip to replace corresponding failing elements. A block or array of fuses is then programmed, i.e., controllably blown, as a way of storing information regarding the repair solution. Thereafter, whenever an attempt is made to access the failing memory locations, the access operation will be detoured to a set of redundancy addresses stored in the fuse array.

While some types of fuses are programmed by applying intense heat directly to the fuse, e.g. via laser irradiation, other types of fuses are electrically programmable or "blowable" by passing a high current through the fuse, e.g., as by applying a higher than normal electric potential across the fuse. Application of such high current causes electromigration of the material of the fuse, causing the resistance of the fuse to increase. The state of the fuse, i.e., the condition of whether the fuse has been programmed or not, can be determined by applying a low electric potential across the fuse and measuring the amount of current that the fuse conducts.

For example, FIG. 1 illustrates a prior art circuit 10 used to program an electrically blowable fuse, and, in addition, to determine whether the fuse is in a programmed state or an unprogrammed state. As shown in FIG. 1, the circuit 10 includes a NAND gate N0 to which fuse logic enable signals FENABLE1 and FENABLE2 are input, an inverter I1 coupled to the output of the NAND gate N0, the electrically blowable fuse F0, a transistor N1 used during an operation to program or "set" the fuse F0, as well as during an operation to determine the state of the fuse F0. Determination of the programming state of the fuse F0 is performed by a resistance measuring circuit 12 based on the output FOUT taken at the drain of transistor N1. Typically, the resistance of the fuse F0 in the unprogrammed state is about 100 ohms to about 200 ohms.

To program or "set" the fuse, inputs FENABLE1 and FENABLE2 are set to "1", i.e., to the high logic level at the upper power supply voltage level Vdd of about 1.0 to 1.5 V, causing the output of the NAND gate N0 to fall to "0" or low. This output from NAND gate N0 is then inverted to the logic high level by inverter I1 and applied to the gate of transistor N1, in turn causing transistor N1 to conduct. To program the fuse, FSOURCE is set to a voltage, e.g., 3.3 V which is higher than an ordinary power supply voltage level of Vdd. The 3.3 V potential is applied across the stack including the fuse F0 and transistor N1. At such time, the input to the resistance measuring circuit 12 is placed in a high impedance or "off" state to prevent current flow thereto. Since FSOURCE is capable of sourcing a high programming current, e.g., about 10 mA, such high current flows through fuse F0 and causes electromigration therein sufficient to change the resistance of the fuse from the minimal 100 to 200 ohm initial resistance to a much higher value such as 5 kilo-ohms. After maintaining the high current long enough to program the fuse, the potential at FSOURCE is lowered again to ground.

At other times, the state of the fuse of being in the programmed state or not is determined by again setting the FENABLE1 and FENABLE2 inputs to the logic high levels, which drives the output of NAND gate N0 to low, in turn causing inverter I1 to drive the gate of transistor N1 to high, causing transistor N1 to conduct. At this time, the potential at FSOURCE is raised from logic level low (usually at ground) to a relatively low voltage permitting conduction, e.g., about 100 mV. FSOURCE is held at such potential for about 100 µs to allow the resistance measuring circuit 12 to determine the state of the fuse. During such operation, circuit 12 measures the current sourced from the FSOURCE node and determines the resistance of the electrically blowable fuse F0. Under the applied biasing conditions, with the voltage applied between the gate and the source of N1 at Vdd (about 1.0 to 1.5 V), and the voltage applied by FSOURCE between the drain and the source of about 100 mV, transistor N1 operates in a linear mode. Unfortunately, the measurement operation is not robust against possible variations in the manufacturing process and operating conditions of the chip, leading to possibly inaccurate measurements which potentially affect the ultimate determination of the state of the fuse. Measurement under such biasing conditions potentially introduces error because a slight deviation in either the voltages applied to the gate of transistor N1 or the drain will cause the amount of current conducted by transistor N1 to vary significantly.

SUMMARY OF THE INVENTION

According to an aspect of the invention, a circuit is provided which is operable to program an electrically alterable element to a programmed state and determine whether the electrically alterable element is in the programmed state or not. Such circuit includes a multiple conduction state field effect transistor or ("multi-state FET") having at least one of a source or a drain coupled to the electrically alterable element to apply a current to the electrically alterable element. The multi-state FET has a first threshold voltage and a second threshold voltage effective at the same time as the first threshold voltage and being higher than the first threshold voltage. The gate is operable to control operation of the multi-state FET in multiple states including a) an essentially nonconductive state when a gate-source voltage applied between the gate and the source does not exceed the first threshold voltage such that a source-drain current between the source and the drain is at most negligible; b) a first conductive state when the gate-source voltage exceeds the first threshold voltage but does not exceed the second threshold voltage such that the source-drain current has a first operating value; and c) a second conductive state when the gate-source voltage exceeds the first threshold voltage and the second threshold voltage such that the source-drain current has a second operating value at least about ten times larger than the first operating value. The circuit further includes a control circuit operable to i) set the gate-source voltage to a magnitude greater than the second threshold voltage to cause the multi-state FET to conduct the source-drain current having the second operating value as a programming current to alter the electrically alterable element from an unprogrammed state to a programmed state, and ii) set the gate-source voltage to a magnitude between the first threshold voltage and the second magnitude to operate the multi-state FET in the first conductive state to determine whether or not the electrically alterable element is in the programmed state by determining an amount of the source-drain current conducted through the electrically alterable element by the multi-state FET when the multi-state FET is in the first conductive state.

DETAILED DESCRIPTION

The embodiments of the invention described here overcome a problem of the prior art in detecting whether an electrically alterable element, e.g., fuse, is in the programmed (blown) state or not. Through use of a novel type of field effect transistor having multiple conduction states, a well-controllable low level amount of current can be caused to flow through the fuse in a low conduction state of the transistor to determine whether the fuse is in the programmed state or not. A more stable bias point is achievable through use of the low conduction state of the transistor. When the fuse is to be programmed, the transistor can be placed in a high conduction state, allowing a current having a much greater magnitude to flow into the fuse and program the fuse.

Figure 1:
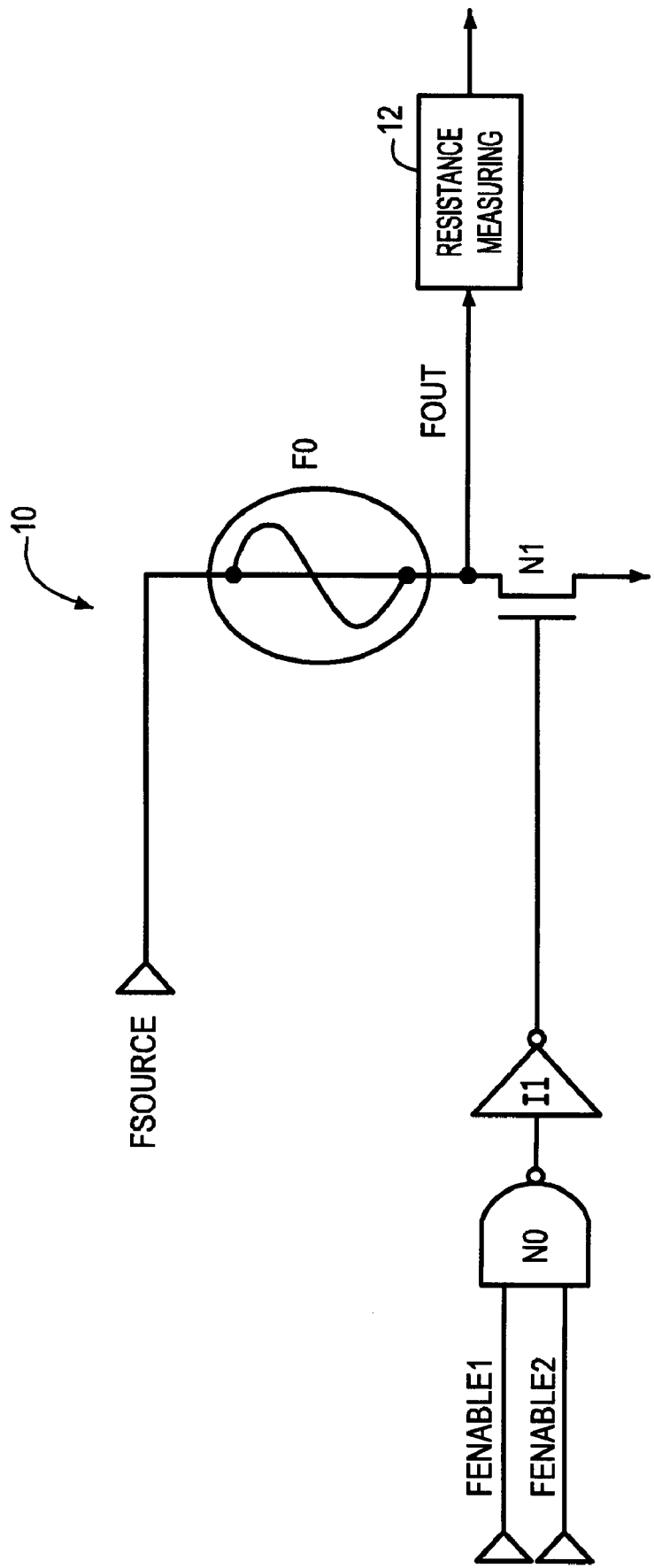
FIG. 1 is a schematic diagram illustrating the structure and operation of a circuit according to the prior art for programming and determining the state of a fuse.
Figure 2:
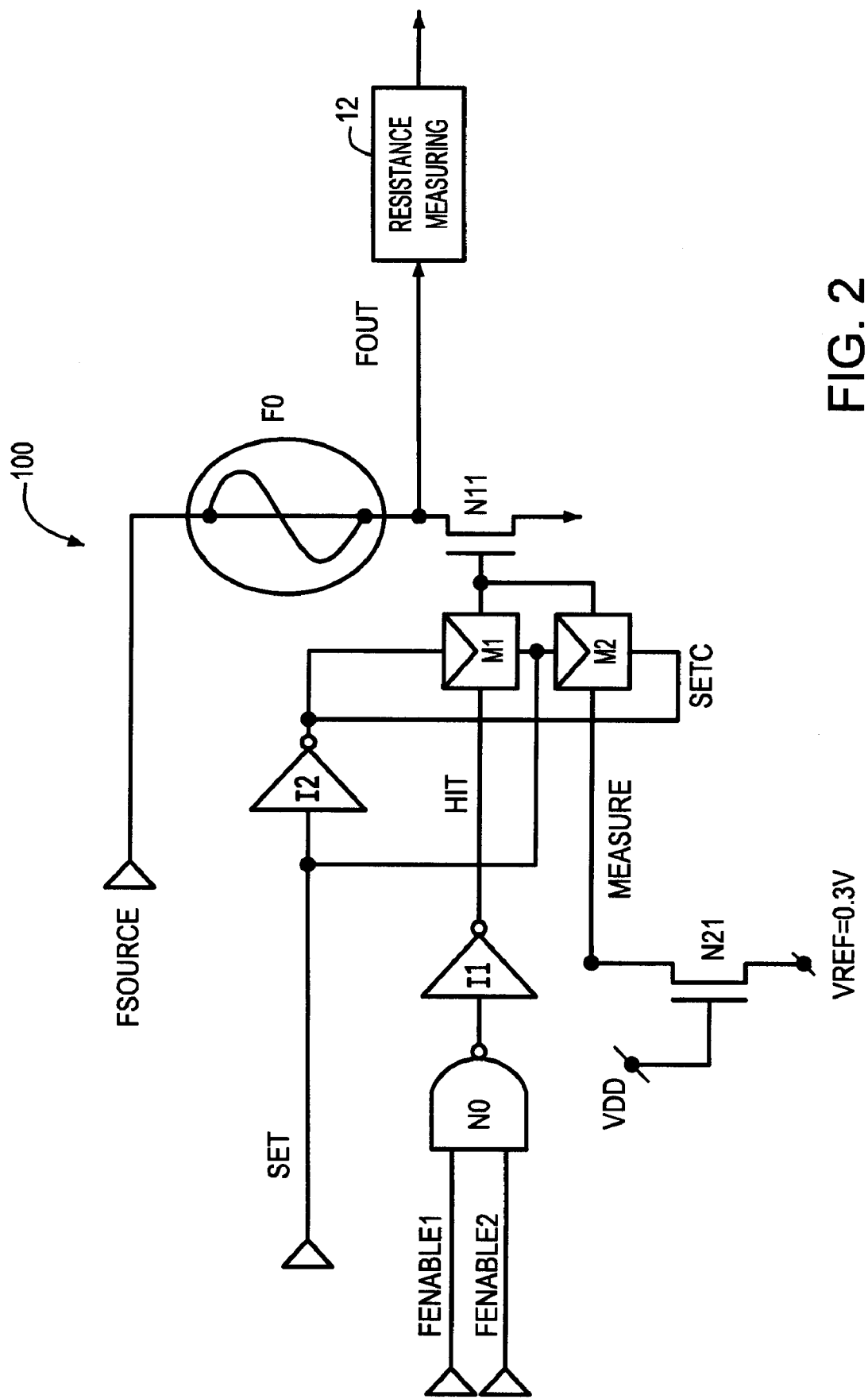
FIG. 2 is a schematic diagram illustrating the structure and operation of a circuit for programming and determining the state of an electrically alterable element, e.g., a fuse, in accordance with an embodiment of the invention.

FIG. 2 illustrates a diagram of a circuit 100 for programming a fuse and determining the state of a fuse in accordance with a preferred embodiment of the invention. As shown therein, the circuit 100 includes elements shown in the above-described prior art circuit 10 (FIG. 1), a NAND gate N0, inverter I1, fuse F0 and resistance measuring circuit 12. However, in contrast to the prior art circuit 10, circuit 100 includes a novel field effect transistor device N11 which has multiple conduction states, the details of which will be described below. In addition to the multiple conduction state field effect transistor ("MCSFET") N11, the circuit 100 has control circuitry including inverter I2, transmission gates M1 and M2, and a passgate transistor device N21 having a source terminal tied to a reference voltage supply (VREF) having a level of about 0.3V. The biasing circuitry is used to operate the MCSFET N11 in its respective conduction states. These conduction states including an essentially nonconductive or "off" state, a first conductive state in which it conducts a relatively small amount of current, and second conductive state in which the MCSFET is fully "on" and conducts a significantly larger amount of current than in the first conductive state.

The multiple-conduction state FET ("MCSFET") is similar to known FETs in that it has an essentially nonconductive state when a gate-source voltage applied between the gate and the source of the MCSFET does not exceed a first threshold voltage. Like known FETs, the MCSFET also has a fully conductive state when the gate-source voltage is above a second threshold voltage or "final threshold voltage" that enables the MCSFET to be fully conductive. The fully conductive state is defined as a level in which an inversion layer forms in the channel region as a result of the voltage applied between the gate and the source of the MCSFET.

However, unlike ordinary FETs, the first threshold voltage and the final threshold voltage have different values. When the gate-source voltage is between the first threshold voltage and the final threshold voltage the MCSFET has another conductive state in which the MCSFET is turned on, but conducts a relatively low amount of current. At that time the MCSFET conducts a current having a magnitude which is ten or more times smaller than the current conducted when the MCSFET exceeds the final threshold voltage level. Illustratively, the amounts of current conducted in each of the one "off" state, and the first and second "on" states which are considered to be in "saturation" are $10^{-3}$ µA/µm, 10 µA/µm, and 900 µA/µm, respectively.

When the gate-source voltage is at a level between the first threshold voltage and the second threshold voltage, the MCSFET is turned on, in that an inversion layer forms in a part of the channel region as a result of the voltage applied between the gate and the source of the MCSFET. The difference is that when the gate-source voltage is above the final threshold voltage and the MCSFET is in the second conductive state, the inversion layer of the MCSFET extends within a larger part of the channel region so as to turn on a larger part of the transistor. Thus, a predetermined part of the MCSFET smaller than the entire MCSFET becomes fully conductive when the gate-source voltage exceeds the first threshold voltage, and a remaining predetermined part of the MCSFET becomes fully conductive when the gate-source voltage exceeds the second or "final" threshold voltage level.

These unique features of the MCSFET allow the circuit 100 in which it is used to operate robustly. Namely, by operating the MCSFET in the high conductive state when programming the fuse and operating the MCSFET in the low conductive state when measuring the resistance to determine the programming state of the fuse, the particular biasing conditions used while measuring the resistance of the fuse F0 can vary by relatively large values without significantly impacting the measurement result.

As to the structure of the MCSFET, in a particular embodiment, the MCSFET is fabricated such that the transistor has one threshold voltage for a first portion of the width of the transistor channel, and has a higher threshold voltage for the remaining portion of the transistor channel width. Preferably, the magnitudes of the "on" current for each of the first and second parts of the transistor also vary. In one embodiment, these results are accomplished by varying the thickness of a gate oxide overlying each of the two portions of the transistor channel width and varying the conditions in which threshold voltage implants are conducted in the two portions of the transistor channel width.

The control circuitry including the transmission gates M1, M2, inverter I2, and passgate N21 tied to the reference voltage supply VREF are used to control the operational state of MCSFET N11 between the "off" state, the low conductive state and the high conductive state. An operation to program the fuse F0 will now be described. When the "SET" signal is asserted at the high logic level, a low logic level signal appears at the output of inverter I2. In addition, the high logic level SET signal is applied to a complementary input of transmission gate M1. These applied inputs cause transmission gate M1 to turn on at that time, which then conducts the signal voltage at the output of inverter I1 to the gate of MCSFET N11. If at that time the inputs FENABLE1 and FENABLE2 to NAND gate N0 are both asserted, a low logic level signal appears at the output of the NAND gate N0 which is then transformed by inverter I1 into a high logic level signal referenced as "HIT" in FIG. 2. The HIT signal has a voltage of Vdd, e.g., a voltage of between about 1.0 V to 1.5 V at the standard high logic level for the chip. When the value of the HIT signal is high, and the SET signal is high, as described above, transmission gate M1 is turned on and the MCSFET N11 is biased to be fully conductive, with the HIT signal applied thereto as a gate bias voltage of about 1.0 V to 1.5 V. During the operation to program the fuse F0, a variable fuse voltage supply level FSOURCE is also set to a higher level, e.g., 3.3 V, which is higher than the ordinary high logic level of 1.0 to 1.5 V, to then apply a high electric potential and high current to program or "set" the fuse F0.

Otherwise, when the SET signal is not asserted, i.e., when SET is at the low logic level, transmission gate M2 is turned on. In addition, a high output appears at the output of inverter I2, which is provided as a set complement signal "SETC" to assist in turning on transmission gate M2. Under such condition, the reference supply voltage VREF is applied to the gate of MCSFET N11 as a bias voltage having a value "MEASURE" to operate MCSFET N11 in the low conduction state.

In operation, before and after the fuse is programmed, when the resistance of the fuse is not being measured, fuse F0 normally has no voltage applied to it. Therefore, when the fuse circuit 100 is in the "off" condition, transmission gates M1 and M1 are normally closed, causing the MCSFET to be in the "off" state.

When transmission gate M1 is turned on, a high logic level voltage is passed to the gate of MCSFET N11, causing it to become fully conductive. At such time, FSOURCE applies a supply voltage level to the fuse F0 at an elevated voltage such as 3.3 V. As a result of this, an electric potential of 3.3 V is applied across the stack which includes the fuse F0 and the MCSFET N11. At such time, the high potential and high conductive state of MCSFET N11 permit a relatively high amount of current, e.g., about 10 mA to then flow through fuse F0, thereby programming or "setting" the fuse, i.e., permanently changing the fuse from an initial low resistance state having 100 to 200 ohms resistance to the high resistance state having about 5 kilo-ohms or greater resistance.

At some other time of operation, when it is desired to determine whether the fuse F0 is in the programmed state or not, the transmission gate M2 is turned on to pass a reference voltage supply level VREF as a bias voltage "MEASURE" to the gate of the MCSFET N11. Such intermediate level voltage applies a gate-source voltage between the gate of the MCSFET and its source which has a value exceeding the first threshold voltage of the MCSFET but which does not exceed the second threshold voltage. As an example, the first threshold voltage can have a value such as 0.3 V and the second threshold voltage a value of about 0.5 V to 0.6 V. In such case, the MEASURE bias voltage has a value between the first and second threshold voltages, e.g., a value of about 0.4 V. At that time, FSOURCE is raised to the ordinary high logic level of about 1.0 to about 1.5. As a result, the intermediate level bias voltage MEASURE is applied to the gate of the MCSFET, and the high logic level voltage is applied to its drain to operate the MCSFET in saturation. At that time, the amount of current conducted by the MCSFET is low, e.g., is 10 or more times smaller than the amount of current conducted by the MCSFET in the fully conductive state.

Under such conditions, the current flowing from FSOURCE through the fuse to node FOUT is proportional to the resistance of the fuse F0. If the fuse is in the programmed state, the resistance of the fuse will be about 5 kilo-ohms. That resistance will be determined as a value in accordance with the amount of current flowing to node FOUT, as measured by the resistance measuring circuit 12. When the fuse is in the programmed state, the current measured will be about 1 V/(5 kilo-ohms+$R_{TX}$), where $R_{TX}$ is the impedance of MCSFET N11 when it is turned on. When the transistor N11 is operated in saturation, $R_{TX}$ is approximately 2 kilo-ohms. As an example of operation when the fuse is in the programmed state having been previously programmed, when the voltage applied as FSOURCE is about 1 V, the amount of current at node FOUT will be about 1 V divided by the sum of 5 kilo-ohms and 2 kilo-ohms, i.e., about 150 microamperes ("μA"). Note that at the time, the FOUT node will be at a potential of 0.25 V and the MCSFET will operate in the saturation region.

As another example, when the fuse is in the unprogrammed state, because it has not been previously programmed, the fuse has a resistance of about 0.1 kilo-ohms. At such time, the amount of current measured at node FOUT will be the FSOURCE voltage of 1 V divided by the sum of the fuse resistance and the impedance of the MCSFET N11 in the saturation region. Thus, the amount of current at node FOUT will be about 1 V divided by 2.1 kilo-ohms; i.e., about 500 microamperes (μA). Note that under such biasing conditions, the FOUT node will be at a potential of about 0.5 V and the MCSFET will operate in the saturation region.

In contrast to the circuit 10 (FIG. 1) according to the prior art, the magnitude of the FSOURCE voltage applied to the drain of the MCSFET during the resistance measuring operation is greater by a factor of about ten or more than the magnitude of the FSOURCE voltage used during the measurement of resistance by the prior art circuit 10 (FIG. 1). This makes the circuit 100 more tolerant to variations and/or noise in the FSOURCE voltage than the prior art circuit 10, since a 50 mV variation in the magnitude of a voltage of 1.0 V applied to circuit 100 represents a magnitude change of 5% while a 50 mV variation in the voltage applied to the prior art circuit 10 represents a 50% change in the magnitude from 100 mV.

In addition, the relatively high voltage at Vdd (1.0 V to 1.5 V) that is applied to the drain of the MCSFET at that time operates the MCSFET in saturation. Variations which occur in the supply voltage or temperature when a transistor is biased in saturation affect the amount of current conducted by the transistor comparatively less than variations which occur when the transistor is biased in a linear region of operation. When a transistor is operated in the linear region, comparatively small changes in the gate-source voltage are reflected by relatively large changes in the output current. Since the MCSFET N11 in the circuit 100 is operated in saturation, the amount of the output current remains relatively stable despite variations in the gate-source voltage. As a result, the measurement of the resistance by circuit 100 is much more tolerant than the prior art circuit 10 (FIG. 1) to variations in biasing conditions, in the temperature of the chip, in the manufacturing process, and other factors.

It should be apparent that such variations in biasing conditions, temperature, and/or manufacturing process are well tolerated without affecting the determination of whether the fuse is in the programmed state or not. It is clear that if the above-determined current measurements can vary significantly from their nominal values without affecting the determination that is ultimately made. Thus, if the result of such variations causes the measured current to vary 25% from its nominal value, the state of the fuse can still be correctly determined. Thus, a 25% variation from the nominal value of the current for the unprogrammed state becomes 500 µA minus 125 µA, equaling about 375 µA. Similarly, a 25% variation from the value of the nominal current for the programmed state can have a value such as 150 µA plus 37.5 µA, equaling about 187 µA. As the larger current measurement is still 100% larger than the smaller current measurement, the circuit 100 is still able to correctly distinguish whether the fuse is in the programmed state or unprogrammed state.

While the embodiments of the invention above have been described in relation to a circuit used to determine whether an electrically blowable fuse is in the blown or "programmed" state or not, the principles of the invention can be applied as well to a circuit used to determine whether another type of electrically alterable element, for example, an electrically programmable antifuse is in the programmed state or not. Such circuit can include control and biasing circuits and signal voltage levels which are essentially the same as those of circuit 100 described above. Antifuses differ from traditional fuses in that in the initial unprogrammed state, an antifuse presents a nonconductive or highly resistive state. In the unprogrammed state, an antifuse has a dielectric element disposed between two conductive members, such that the dielectric element normally prevents the antifuse from conducting in such state.

The antifuse is programmed or "blown" by applying a higher than ordinary electric potential across the dielectric element, causing the dielectric element to break down and become significantly less resistive in the process. While the antifuse retains relatively high resistivity even after being programmed, the programmed state of the fuse can be distinguished from the unprogrammed state by a circuit 100 such as that shown and described above with reference to FIG. 2. The resistivity of the antifuse before and after being programmed varies between a value such as 100 kilo-ohms and about 2 kilo-ohms, respectively. These resistivity values, in turn, lead to significantly different values of about 10 µA and 250 µA in the amount of current conducted through circuit 100 for the different states.

In addition, circuits which determine the state of more than one fuse and/or antifuse can benefit from the principles of the invention described above in accordance with embodiments of the invention. The more robust measurements obtained by the circuitry described herein can be used to obtain more accurate determinations of the state of such fuses and/or antifuses.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A circuit operable to program an electrically alterable element to a programmed state and determine whether said electrically alterable element is in the programmed state or not, comprising:
    a multiple conduction state field effect transistor ("multi-state FET") having a source, a drain, and a gate operable to control conduction between said source and said drain, at least one of said source or said drain being coupled to said electrically alterable element to apply a current to said electrically alterable element, said FET having a first threshold voltage and a second threshold voltage effective at the same time as said first threshold voltage, said gate being operable to control operation of said multi-state FET in multiple states including a) an essentially nonconductive state when a gate-source voltage applied between said gate and said source does not exceed said first threshold voltage and does not exceed said second threshold voltage such that a source-drain current between said source and said drain is at most negligible; b) a first conductive state when said gate-source voltage exceeds said first threshold voltage and does not exceed said second threshold voltage such that said source-drain current has a first operating value when said multi-state FET operates in saturation; and c) a second conductive state when said gate-source voltage exceeds said first threshold voltage and said second threshold voltage such that said source-drain current has a second operating value at least about ten times larger than said first operating value; and
    a control circuit operable to i) set said gate-source voltage to a magnitude greater than said second threshold voltage to cause said multi-state FET to conduct said source-drain current having said second operating value as a programming current to alter said electrically alterable element from an unprogrammed state to a programmed state, ii) set said gate-source voltage to a magnitude between said first threshold voltage and said second threshold voltage to operate said multi-state FET in said first conductive state to determine whether or not said electrically alterable element is in said programmed state by determining an amount of said source-drain current conducted through said electrically alterable element by said multi-state FET when said multi-state FET is in said first conductive state.

2. The circuit as claimed in claim 1, wherein said electrically alterable element is of the type fuse, wherein said programmed state of said fuse is characterized by significantly higher resistivity than said initial unprogrammed state.

3. The circuit as claimed in claim 2, wherein said control circuit is operable to determine whether or not said fuse is in said programmed state when a voltage having a magnitude greater than said second threshold voltage is applied across said fuse.

4. The circuit as claimed in claim 2, wherein said control circuit includes a first control sub-circuit operable to apply said gate-source voltage at said magnitude higher than said second threshold voltage to said multi-state FET, and a second control sub-circuit operable to apply said gate-source voltage at said magnitude between said first threshold voltage and said second threshold voltage to said multi-state FET.

5. The circuit as claimed in claim 4, wherein said first control sub-circuit includes a first transmission gate operable when open to pass said gate-source voltage having said magnitude greater than said second threshold voltage to said gate of said multi-state FET and said second control sub-circuit includes a second transmission gate operable to pass said gate-source voltage having said magnitude between said first threshold voltage and said second threshold voltage to said gate of said multi-state FET when said first transmission gate is closed.

6. The circuit as claimed in claim 5, wherein said first transmission gate is operated by a first control signal and said second transmission gate is operated by a second control signal, said circuit further comprising an inverter, wherein said inverter is operable to generate one of said first control signal or said second control signal by inverting the other of said first control signal or said second control signal such that only one of said first transmission gate and said second transmission gate conducts at one time.

7. The circuit as claimed in claim 5, wherein said second control sub-circuit further includes a passgate operable to transfer said gate-source voltage having said magnitude between said first threshold voltage and said second threshold voltage to said transmission gate.

8. The circuit as claimed in claim 3, wherein said first control sub-circuit includes an input circuit operable to apply said gate-source voltage having a magnitude greater than said second threshold voltage only when a first program control input and a second program control input to said input circuit are enabled.

9. An integrated circuit including the circuit as claimed in claim 1.

10. The circuit as claimed in claim 1, wherein said electrically alterable element is of the type antifuse, wherein said programmed state of said antifuse is characterized by significantly lower resistivity than said initial unprogrammed state.

11. A method for programming a fuse to a programmed state and for determining whether or not the fuse is in the programmed state, comprising:
providing a multi-state field effect transistor ("FET") having at least one of a source or a drain coupled to the fuse, said FET having a first threshold voltage and a second threshold voltage effective at a same time as said first threshold voltage;
applying a gate-source voltage between a gate and a source of said FET at a magnitude exceeding said first threshold voltage and said second threshold voltage to operate said FET in a relatively high conductive state to apply a programming current to the fuse to program the fuse; and
applying said gate-source voltage at a magnitude exceeding said first threshold voltage and not exceeding said second threshold voltage to operate said FET in saturation in a relatively low conductive state permitting a measuring current having a relatively low magnitude to flow through the fuse to determine whether or not the fuse is in the programmed state, wherein said measuring current is at least ten times smaller than said programming current.

12. The method as claimed in claim 11, further comprising switching said FET from at least one of said relatively high conductive state or said relatively low conductive state to an "off" state to prevent current from being applied to the fuse.

13. The method as claimed in claim 11, wherein said step of applying said gate-source voltage at said magnitude exceeding said second threshold voltage includes operating a first transmission gate to pass said gate-source voltage at said magnitude greater than said second threshold voltage and said step of applying said gate-source voltage at said magnitude exceeding said first threshold voltage and not exceeding said second threshold voltage includes turning off said first transmission gate and turning on a second transmission gate to pass said gate-source voltage having said magnitude between said first threshold voltage and said second threshold voltage to said gate of said multi-state FET.

14. The method as claimed in claim 13, wherein said step of applying said gate-source voltage exceeding said second threshold voltage includes applying a first control signal to said first transmission gate and said step of applying said gate-source voltage between said first threshold voltage and said second threshold voltage includes applying a second control signal to said second transmission gate, the method further comprising generating one of said first control signal or said second control signal by inverting the other of said first control signal or said second control signal such that only one of said first transmission gate and said second transmission gate is turned on at one time.

15. The method as claimed in claim 13, generating a first program control input and a second program control input and applying said gate-source voltage exceeding said second threshold voltage only when said first program control input is enabled and said second program control input is enabled.

* * * * *